United States Patent [19]
Watanabe

[11] Patent Number: 5,808,524
[45] Date of Patent: Sep. 15, 1998

[54] SURFACE WAVE FILTER WITH A SPECIFIED TRANSDUCER IMPULSE TRAIN THAT REDUCES DIFFRACTION

[75] Inventor: Toru Watanabe, Toyama, Japan

[73] Assignee: Murata Manufacturing Co., Ltd., Japan

[21] Appl. No.: 575,892

[22] Filed: Dec. 20, 1995

[30] Foreign Application Priority Data

Dec. 20, 1994 [JP] Japan .................................... 6-316912

[51] Int. Cl.⁶ .................................................. H03H 9/64
[52] U.S. Cl. ..................................... 333/196; 310/313 C
[58] Field of Search .................................. 333/193–196; 310/313 R, 313 B, 313 C, 313 D

[56] References Cited

U.S. PATENT DOCUMENTS 3,633,132  1/1972  Hartemann ...................... 310/313 C X
4,007,433  2/1977  Houkawa et al. ................ 310/313 C X

FOREIGN PATENT DOCUMENTS 56-16313 A  2/1981  Japan ................................. 333/196

OTHER PUBLICATIONS

Suzuki, Y. et al., "Some Studies on Saw Resonators and Multiple–Mode Filters", 1976 Ultrasonics Symposium Proceedings, 1976, pp. 297–302.

*Primary Examiner*—Robert J. Pascal
*Assistant Examiner*—Barbara Summons
*Attorney, Agent, or Firm*—Ostrolenk, Faber, Gerb & Soffen, LLP

[57] ABSTRACT

A transversal SAW filter capable of reducing the effect of diffraction to achieve desired transmission characteristics without increasing the size of the surface wave substrate includes first and second IDTs arranged on a surface wave substrate so as to be spaced from each other by a predetermined distance. The first IDT has a plurality of impulses and the impulse in the 2n–th (n is a natural number) position counted from an impulse located at a maximum cross length in the 0–th position toward the second IDT has a magnitude which is equal to a magnitude of the (2n–1)–th impulse multiplied by –1.0.

12 Claims, 13 Drawing Sheets

SURFACE WAVE FILTER WITH A SPECIFIED TRANSDUCER IMPULSE TRAIN THAT REDUCES DIFFRACTION

BACKGROUND OF THE INVENTION

1. Field of the Invention

The present invention relates to surface wave filters and, more particularly, to a transversal surface wave filter wherein a plurality of interdigital transducers IDTs are formed on a surface wave substrate.

2. Description of the Related Art

A transversal surface acoustic wave (hereinafter referred to as SAW) filter has a structure wherein a plurality of IDTs are formed on a surface wave substrate. An example of such a SAW filter will be described with reference to FIG. 1.

A SAW filter 1 has IDTs 3 and 4 arranged on a surface wave substrate 2 such that the IDTs are spaced from each other by a predetermined distance. The surface wave substrate 2 is configured by a piezoelectric substrate, or an insulated substrate on which a piezoelectric thin film is formed. One of the IDTs 3 and 4 functions as an input IDT and the other of the IDTs 3 and 4 functions as an output IDT. Each of the IDTs 3 and 4 is constituted by a pair of comb-like electrodes having a plurality of electrode fingers which are interdigitated with each other.

In order to obtain desired transmission characteristics, as shown in FIG. 1, in a typical SAW filter 1, one of the IDTs of the filter 1, i.e., the IDT 3, is constituted by a normal IDT whose electrode fingers are interdigitated with each other such that there is a constant length of the fingers by which the fingers extending from opposite directions overlap each other (hereinafter referred to as "cross length"). The other IDT, i.e., the IDT 4, is constituted by an IDT whose electrode fingers are interdigitated with each other so as to have weighted or non-uniform cross lengths.

In a conventional SAW filter 1, one of the IDTs thereof, i.e., the IDT 4, has weighted cross lengths to obtain desired transmission characteristics of the filter. However, since the IDT 4 includes a plurality of relatively small cross lengths, there has been a problem in that if the overall cross length is not sufficient, diffraction makes it difficult to obtain the desired transmission characteristics, thereby deteriorating the filter characteristics.

It is possible to reproduce an impulse train corresponding to the desired transmission characteristics by forming the IDT 4 to be relatively large, so that even the relatively smaller cross lengths are sufficiently large for such a purpose. However, such a configuration makes the size of the surface wave substrate 2, especially the width thereof too large, which makes the device too large as a whole and increases the cost. In addition, this makes the impedance too low, resulting in a possibility of deterioration of characteristics due to triple transit echoes (T.T.E.). It is therefore impossible to obtain sufficient characteristics by only making the surface wave substrate 2 larger.

SUMMARY OF THE INVENTION

To overcome the above problems with conventional SAW filters, the preferred embodiments of the present invention provide a SAW filter having IDTs with weighted cross lengths wherein the effect of diffraction can be reduced to make it possible to reliably obtain desired transmission characteristics without having to use a large surface wave substrate.

According to the preferred embodiments of the present invention, a SAW filter includes first and second IDTs arranged on a surface wave substrate and wherein the first IDT has weighted cross lengths so that the interdigitated finger electrodes create an impulse train having only a main lobe and having no side lobe, as described more completely below.

A SAW filter according to the preferred embodiments of the present invention is arranged such that in the impulse train of the first IDT, the impulse in the 2n-th (where n is a natural number) position counted from the maximum impulse, i.e., the 0-th impulse, in at least either of the directions toward and away from the second IDT has a magnitude which is equal to a magnitude of the (2n−1)-th impulse multiplied by −1.0.

Preferably, the absolute value of the 2n-th impulse at the end of the first IDT which is closer to the second IDT is smaller than that of the (2n−1)-th impulse.

The preferred embodiments of the present invention may be applied to any SAW filter as long as such a filter has a structure wherein first and second IDTs as described above are located on a surface wave substrate. For example, the surface wave substrate may be a piezoelectric substrate made of piezoelectric ceramic, piezoelectric single crystal and the like or a part obtained by forming a piezoelectric thin film such as a ZnO thin film on an insulated substrate.

When a surface wave substrate having a structure obtained by forming a piezoelectric thin film on an insulated substrate is used, the first and second IDTs may be formed between the piezoelectric thin film and the insulated substrate.

Further, SAW filters to which the preferred embodiments of the present invention can be applied include filters having first and second IDTs arranged to have the relationship as described above and filters having another IDT formed on the surface wave substrate, i.e., those having three or more IDTs located on a surface wave substrate. In the latter case, the advantages of the preferred embodiments of the present invention can be achieved by forming two of the IDTs as the first and second IDTs as described above.

In a SAW filter according to the preferred embodiments of the present invention, a reflector such as a grating reflector may be provided at a location spaced from the first and second IDTs in the direction of the propagation of surface waves.

Moreover, a SAW filter according to the preferred embodiments of the present invention may include a first IDT as described above, and any configuration for the second IDT because the preferred embodiments of the present invention are not limited to any particular configuration of the second IDT. Specifically, the second IDT may be a normal IDT having uniform cross lengths or an IDT having varying cross lengths.

In a SAW filter according to the preferred embodiments of the present invention, the 2n-th impulse at the first IDT has a magnitude that is the magnitude of the (2n−1)-th impulse multiplied by −1.0. Therefore, the distribution of the interdigitated portions of the IDT is biased toward one side when viewed in the direction in which the impulses propagate. Specifically, as will be apparent from at least one of the preferred embodiments of the present invention to be described later, one end of each impulse is aligned with one end of the impulse that is located at a maximum cross length and with one side edge of the surface wave substrate in the area wherein the 2n-th impulse has a magnitude which is the magnitude of the (2n−1)-th impulse multiplied by −1.0. As a result, the effect of diffraction associated with the propagation of surface waves is reduced.

In addition to the reduction of diffraction, basic transmission characteristics are not subjected to significant changes because the weighting itself is left almost unchanged.

In short, the preferred embodiments of the present invention are arranged to have an impulse train that reflects desired transmission characteristics, the 2n-th impulse is made to have a magnitude which is -1.0 times that of the (2n-1)-th impulse to reduce diffraction with no substantial change in transmission characteristics, thereby achieving desired filter characteristics.

Further, in the configuration wherein the 2n-th impulse at the end of the first IDT closer to the second IDT has an absolute value smaller than that of the (2n-1)-th impulse, one end of the 2n-th impulse at the end is farther from the side edge of the surface wave substrate than one end of the (2n-1)-th impulse. Specifically, while one end of each of the impulses from the impulse located at the maximum cross length up to the (2n-1)-th impulse immediately before the 2n-th impulse at the end is aligned with one side edge of the surface wave substrate, one end of the 2n-th impulse at the end is not aligned with the ends of the other impulses and is located inside the surface wave substrate. Although the discontinuity of the distribution of an electrical field tends to excite unwanted waves at the end of the first IDT closer to the second IDT, this configuration suppresses such excitation of unwanted waves to improve transmission characteristics further because of the formation of the 2n-th impulse at the end as described above.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

FIG. 6b is a plan view illustrating the finger electrode configuration of the first preferred embodiment of FIG. 6a.

DETAILED DESCRIPTION OF PREFERRED EMBODIMENTS

Figure 2:
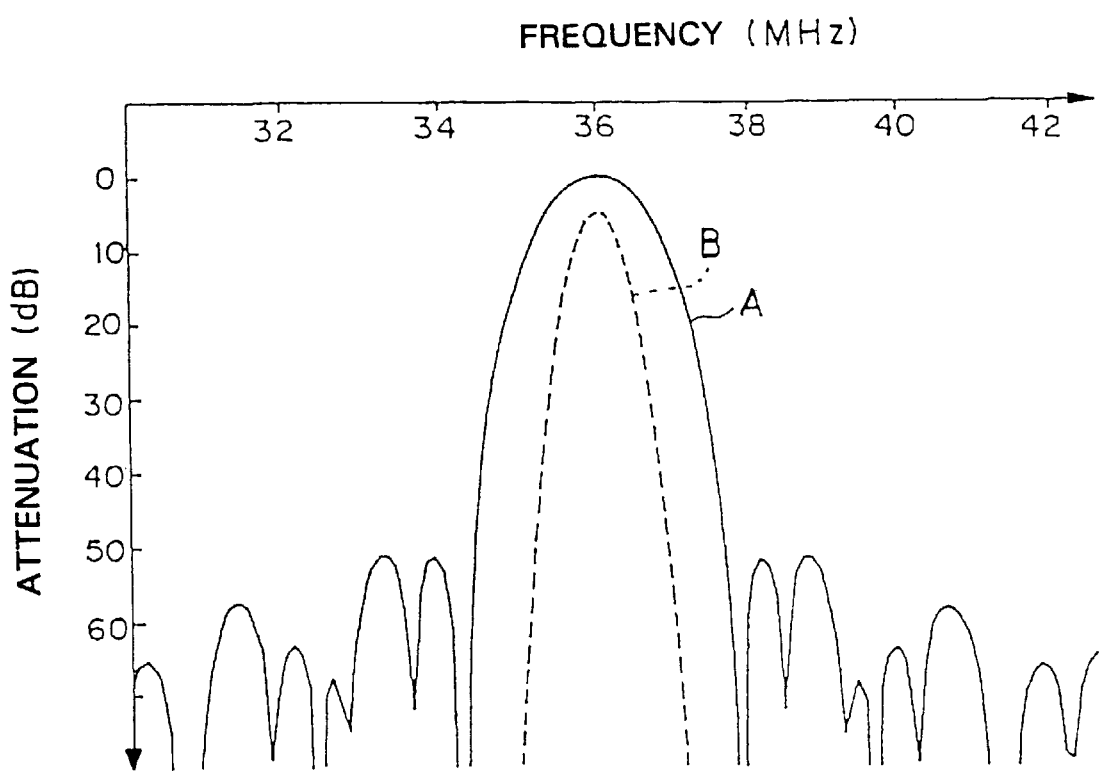
FIG. 2 illustrates attenuation-frequency characteristics to be obtained.

FIG. 2 illustrates an example of desired transmission characteristics of a SAW filter. In FIG. 2, the solid line A indicates attenuation-frequency characteristics which are plotted in accordance with the coordinates shown in FIG. 2, and the broken line B indicates the attenuation-frequency characteristic of a major part which is plotted with the attenuation shown along the vertical axis magnified five times.

Figure 3:
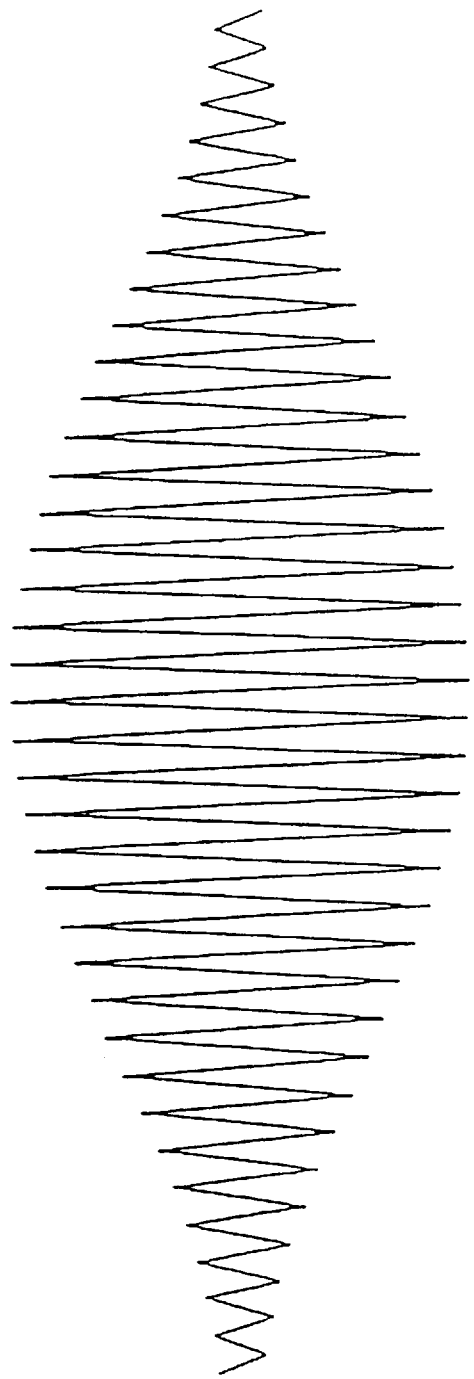
FIG. 3 illustrates an example of an impulse train to achieve the characteristics shown in FIG. 2.
Figure 4:
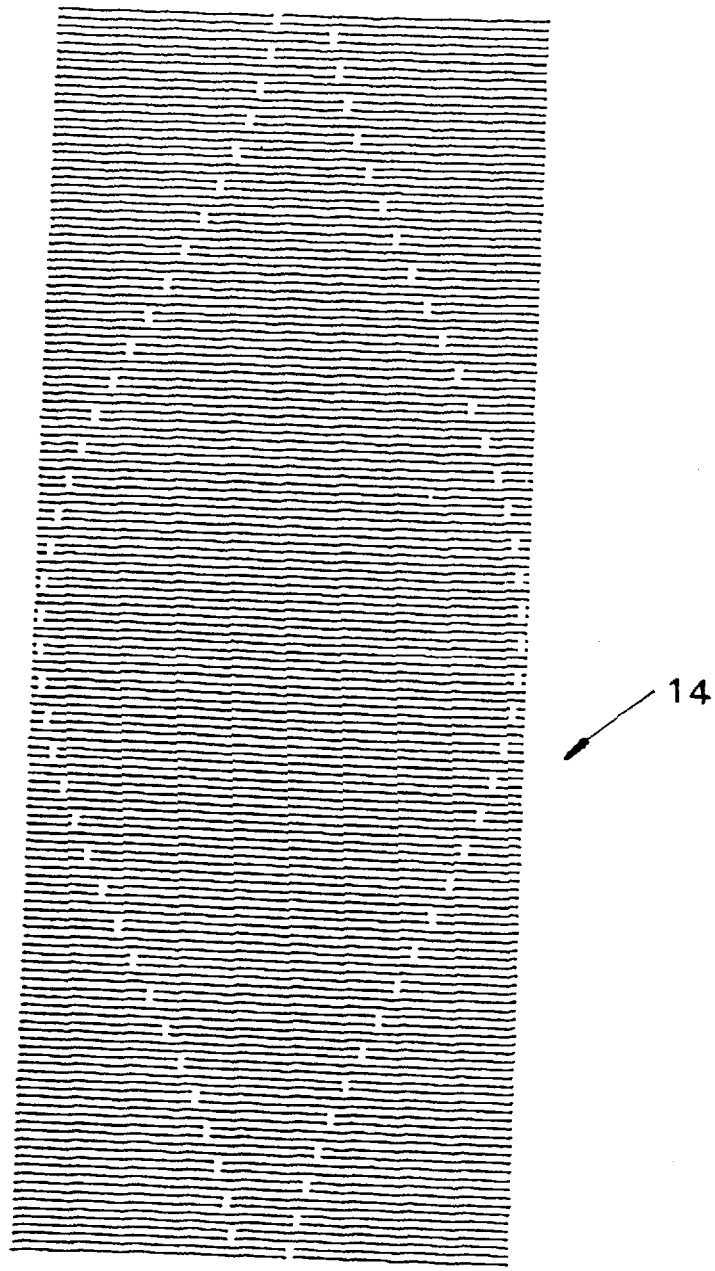
FIG. 4 is a plan view of an IDT configured to obtain the impulse train shown in FIG. 3.

FIG. 3 shows an impulse train which is obtained by performing inverse Fourier transformation on the transmission characteristics shown in FIG. 2. FIG. 4 shows an IDT configured based on the impulse train shown in FIG. 3.

Figure 1:
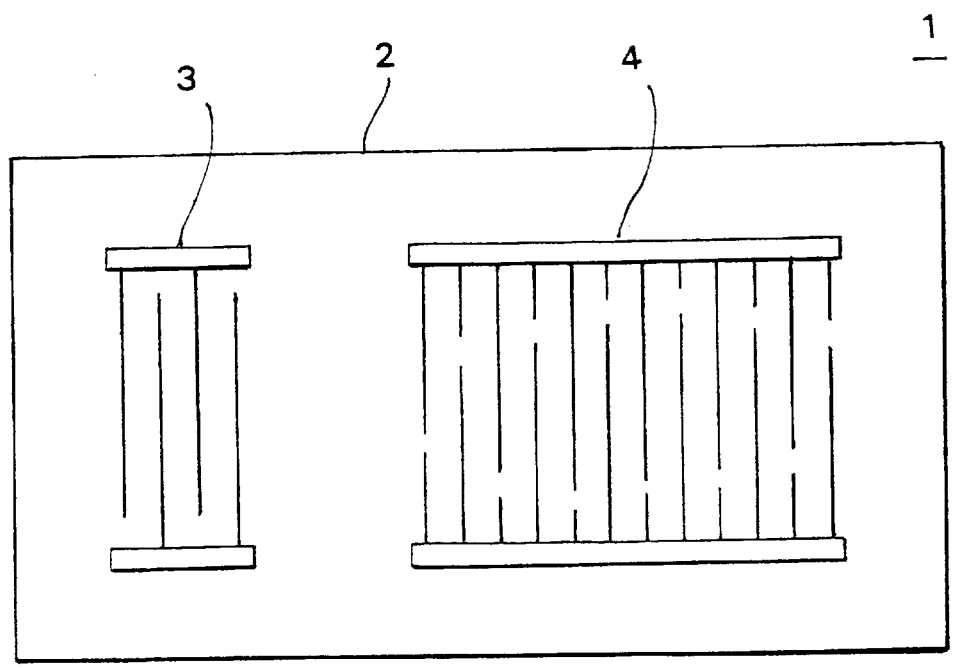
FIG. 1 is a plan view illustrating a conventional SAW filter.

The IDT shown in FIG. 4 corresponds to the above-described IDT 4 shown in FIG. 1 and has weighted cross lengths to achieve the impulse train shown in FIG. 3. The line formed by connecting the portions of the IDT 14 left white in FIG. 4 is an envelope.

Figure 5:
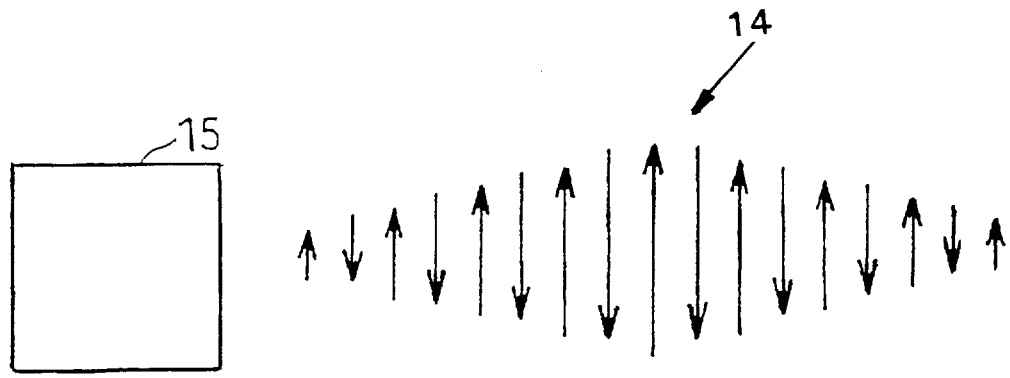
FIG. 5 schematically illustrates a configuration of a conventional SAW filter.

FIG. 5 schematically illustrates a transversal SAW filter utilizing an IDT 14 having the configuration as described above. Specifically, a second IDT 15 is provided at a predetermined distance from the first IDT 14 schematically represented by the impulse train. The second IDT 15 is constituted by a normal IDT similar to the IDT 3 in FIG. 1.

With the configuration of electrodes of the SAW filter as shown in FIG. 5, when a surface wave is excited with the IDT 15 serving as the input IDT, for example, the excited surface wave propagates toward the IDT 14. In this case, there has been a problem in that diffraction prevents characteristics from being reproduced in sufficient correspondence to the impulse train schematically shown in FIG. 3.

Figure 6A:
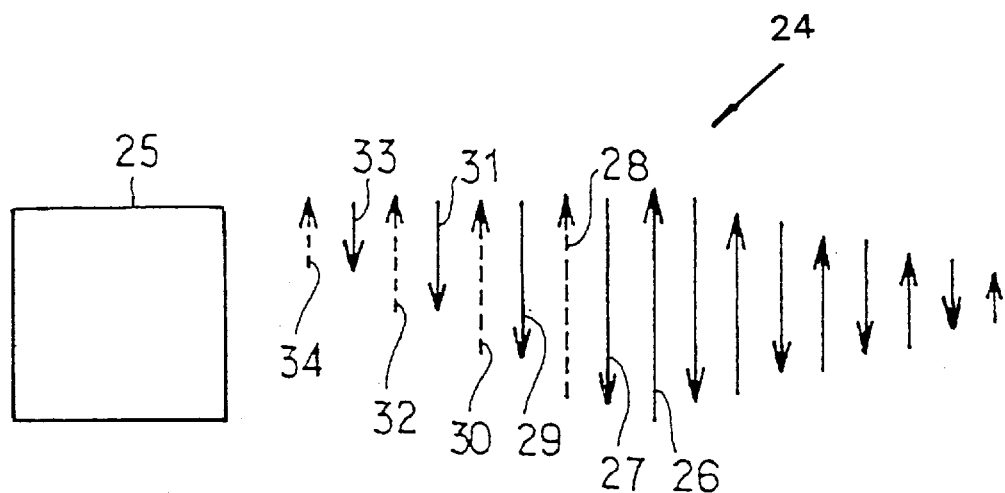
FIG. 6a is a schematic configuration diagram illustrating the structure of an electrode of a SAW filter according to a first preferred embodiment of the present invention.
Figure 6B:
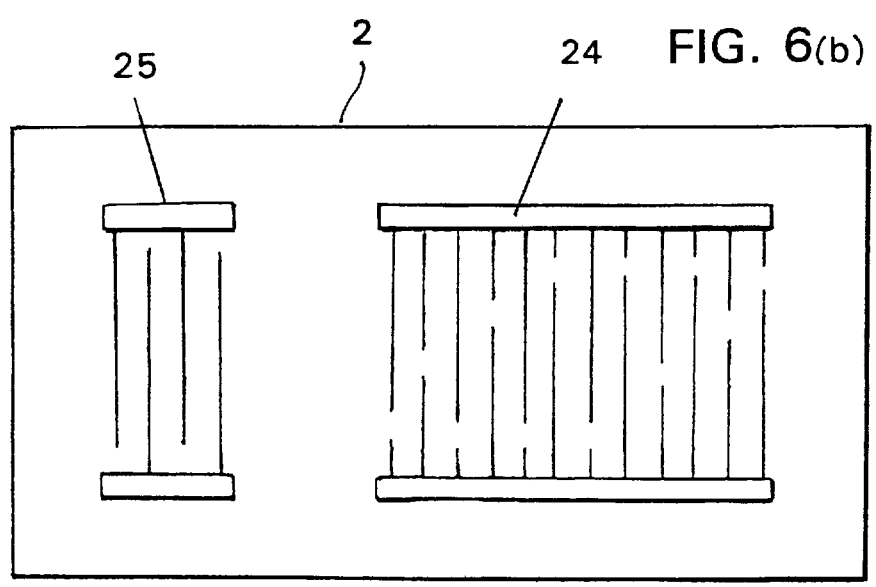

The preferred embodiments of the present invention have been conceived taking the above-described problem into consideration. FIGS. 6a and 6b schematically illustrate a configuration of a preferred embodiment of the present invention.

A first preferred embodiment of the present invention will now be described.

FIG. 6a is a schematic diagram illustrating a configuration of an electrode of a SAW filter according to the first preferred embodiment of the present invention. FIG. 6b is a plan view illustrating the finger electrode configuration for achieving the impulse train shown in FIG. 6a.

In the SAW filter of the first preferred embodiment present invention, a first IDT 24 and a second IDT 25 are arranged so as to be spaced from each other by a predetermined distance on a surface wave substrate 2. The IDT 24 in FIG. 6a is represented by an impulse train like that shown in FIG. 5. Further, the IDT 25 is constituted by a normal IDT similar to the conventional IDT 15. Although not shown, the surface wave substrate 2 is preferably configured similarly to that of the conventional SAW filter 1 shown in FIG. 1.

A comparison of the finger electrode configuration of IDT 24 in FIG. 6b and that of IDT 4 shown in FIG. 1 illustrates the differences between the structure of the first preferred embodiment of the present invention and the prior art. The electrode finger configuration shown in FIG. 6b creates the impulse train shown in FIG. 6a.

As apparent from comparison between the impulse train at the IDT 24 shown in FIG. 6a and the impulse train at the conventional IDT 14 shown in FIG. 5, among impulses 27 through 34 in the impulse train at the IDT 24 of the present preferred embodiment which are located closer to the second IDT 25 than an impulse 26 corresponding to the maximum cross length, the 2n–th impulse counted from the impulse 26 in the 0–th position has a magnitude which is substantially equal to a magnitude of the (2n–1)–th impulse multiplied by –1.0. As a result, one end of each of the impulses 27 through 34, i.e., the upper ends of those impulses, are aligned with the upper end of the impulse 26.

Therefore, when the IDT 25 is functioning as the input IDT, it is possible to reduce diffraction in a surface wave excited by the IDT 25 which occurs during the propagation to the IDT 24. In addition, the impulse train at the IDT 24 is adapted and arranged so that the transmission characteristics shown in FIG. 2 can be obtained. Thus, there is no substantial reduction in the transmission characteristics.

The effect of the use of the IDT 24 shown in FIGS. 6a and 6b will now be described with reference to the specific result of an experiment in comparison to the prior art shown in FIG. 5.

Figure 7:
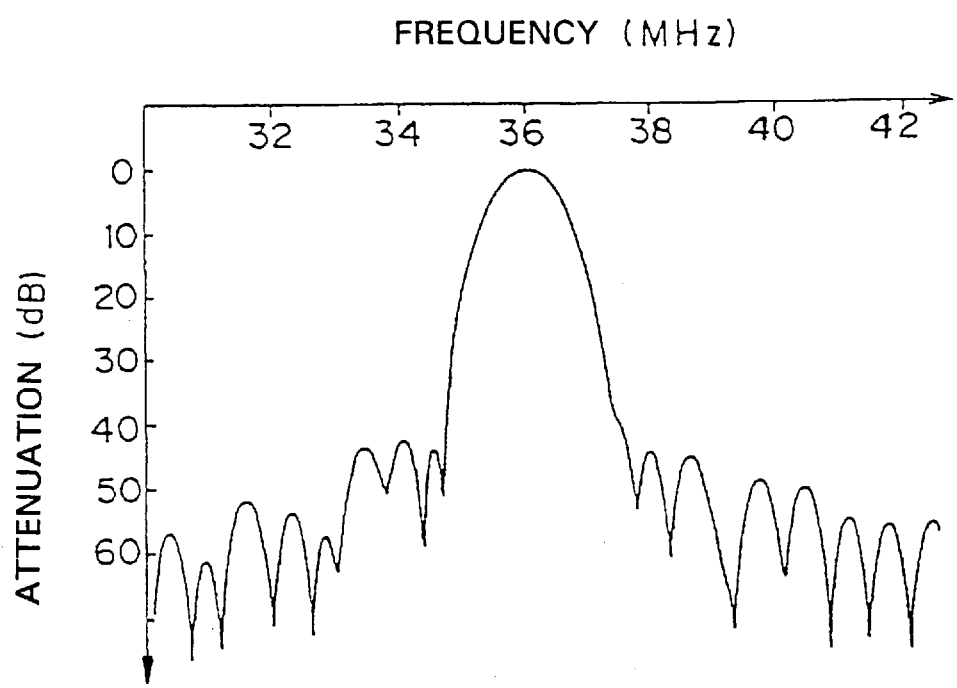
FIG. 7 illustrates attenuation-frequency characteristics of a conventional SAW filter.

First, as the conventional SAW filter shown in FIG. 5, there is prepared a SAW filter wherein the first IDT 14 has 36 pairs of electrode fingers with a maximum cross length of 15λ, the second IDT 15 is a normal IDT having 20 pairs of electrode fingers; and the central frequency is 36 MHz. The surface wave substrate used is obtained by laminating ZnO thin films on a glass substrate. FIG. 7 shows attenuation-frequency characteristics of the this conventional SAW filter.

Figure 8:
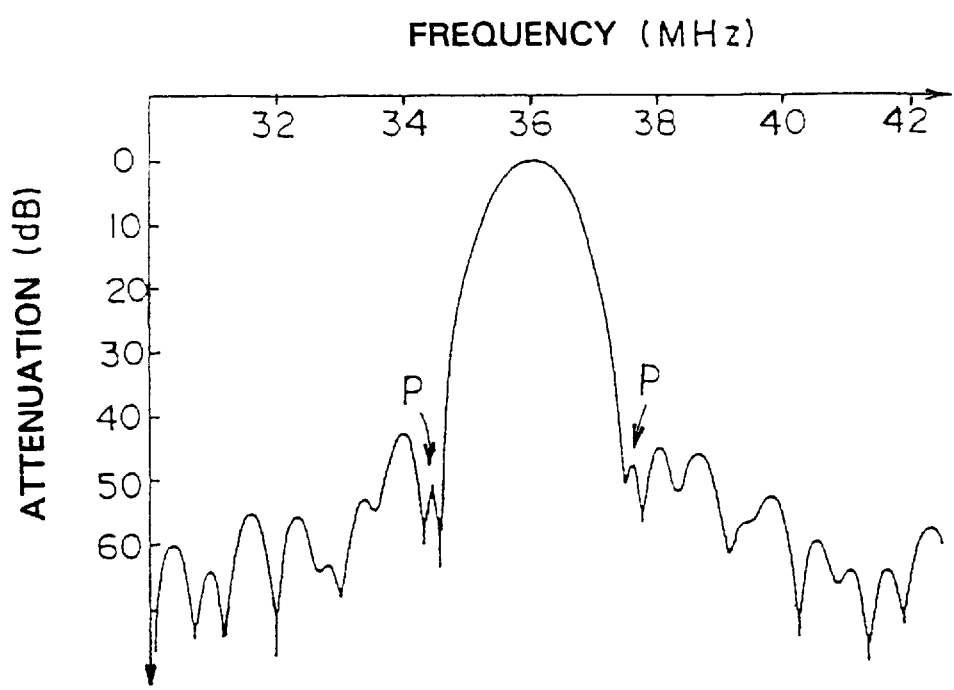
FIG. 8 illustrates attenuation-frequency characteristics of the SAW filter according to the first preferred embodiment of the present invention.

Next, a SAW filter of the present preferred embodiment is fabricated which has an IDT 24 arranged to produce an impulse train shown in FIG. 6a and formed to have 36 pairs of electrode fingers and a maximum cross length of 15λ as the first IDT and which is otherwise the same as the above-described conventional SAW filter. FIG. 8 shows the result of the measurement of the attenuation-frequency characteristics of the SAW filter of the first preferred embodiment of the present invention.

As apparent from the comparison between the attenuation-frequency characteristics shown in FIGS. 7 and 8, the SAW filter of this preferred embodiment achieves larger attenuation than the prior art in the areas indicated by the arrows P. This is attributable to the reduction of the effect of diffraction as described above.

A second preferred embodiment of the present invention will now be described.

Figure 9:
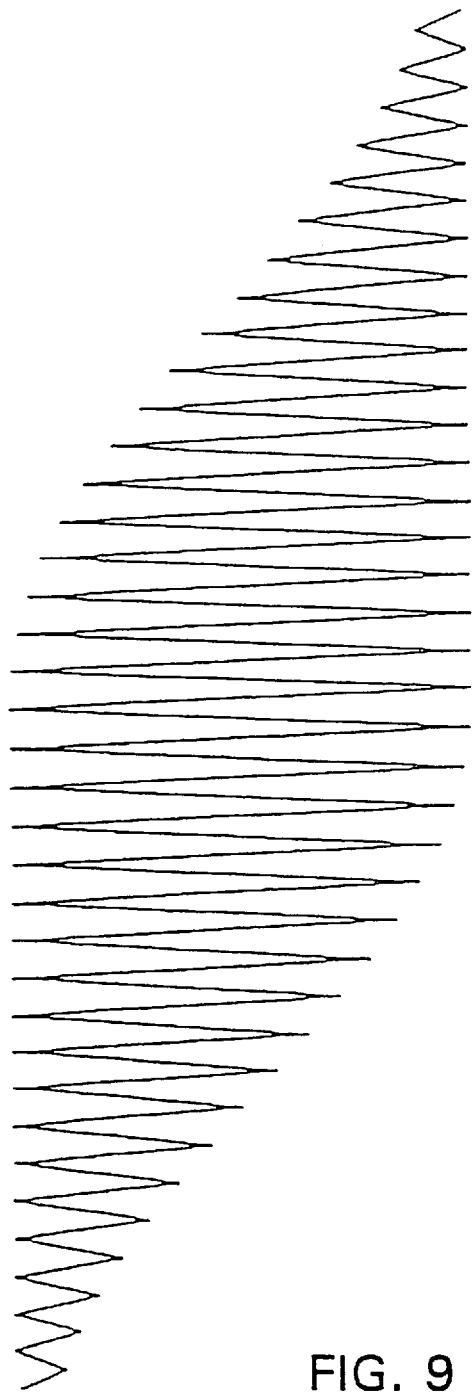
FIG. 9 illustrates a impulse train at a first IDT of a SAW filter according to the second preferred embodiment of the present invention.
Figure 10:
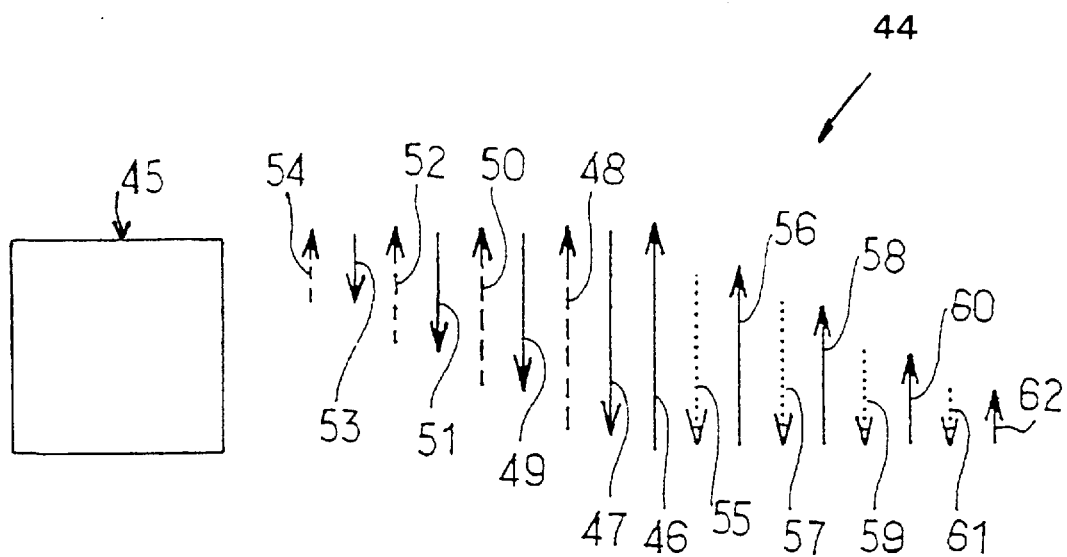
FIG. 10 is a schematic configuration diagram illustrating the structure of an electrode of the SAW filter according to the second preferred embodiment of the present invention.

In the preferred embodiment shown in FIGS. 6a and 6b, each of the impulses at the IDT 24 closer to the second IDT 25 than the impulse 26 with the maximum cross length is inclined as described above, i.e., one end of each impulse is aligned with one end of the maximum impulse 26. In this second preferred embodiment, however, either end of each impulse on both sides of the maximum impulse may be aligned with either end of the maximum impulse 26. An example of such a configuration will be described with reference to FIGS. 9 through 11. FIG. 9 shows an impulse train which corresponds to the desired transmission characteristics shown in FIG. 2 and in which each impulse is inclined on both sides of the impulse at the maximum cross length. FIG. 10 schematically illustrates a configuration of a SAW filter wherein a first IDT is configured to provide such an impulse train.

As apparent from FIG. 10, in the SAW filter according to the second preferred embodiment, a first IDT 44 and a second IDT 45 are provided and arranged spaced from each other by a predetermined distance. The second IDT 45 has the same configuration as that of the conventional IDT 15.

In the first IDT 44, the plurality of impulses on both sides of an impulse 46 at the maximum cross length are arranged so that the 2n–th impulse has a magnitude which is the magnitude of the (2n–1)–th impulse multiplied by –1.0 where the impulse 46 is the 0–th impulse.

Figure 11:
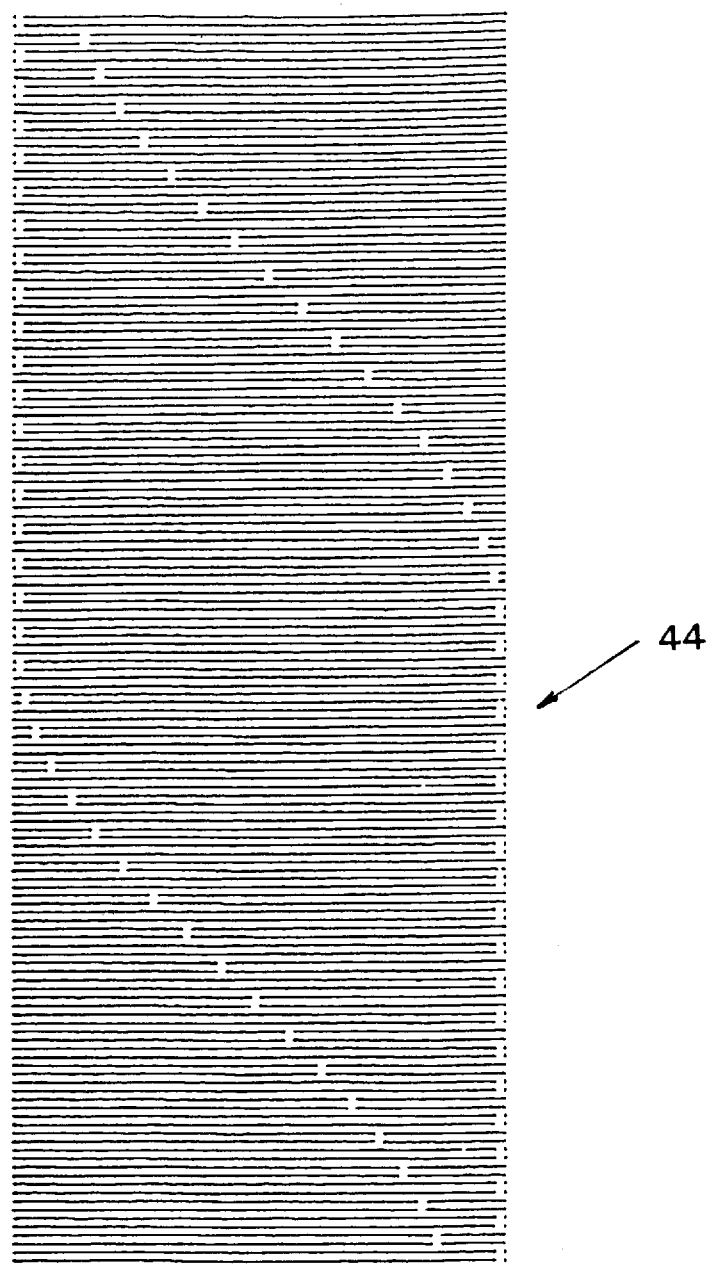
FIG. 11 is a plan view of the first IDT of the SAW filter according to the second preferred embodiment of the present invention.

Specifically, both of groups of impulses 47 through 54 and 55 through 62 are inclined as illustrated. In this case, the upper ends of the impulses 47 through 54 are aligned with the upper end of the impulse 46 and the lower ends of the impulses 55 though 62 are aligned with the lower end of the impulse 46. FIG. 11 illustrates a specific example of the first IDT 44 having an impulse train formed as described above. The IDT 44 shown in FIG. 11 is configured as an IDT having weighted cross lengths to achieve the impulse train shown in FIG. 9.

A third preferred embodiment of the present invention will now be described.

In the above-described first and second preferred embodiments, an inclined structure is formed as described above so that the 2n–th impulse has a magnitude which is the magnitude of the (2n–1)–th impulse multiplied by –1.0. The absolute value of the magnitude of the 2n–th impulse at the end of the first IDT on the side of the second IDT is preferably made smaller than the magnitude of the (2n–1)–th impulse multiplied by –1.0. An example of such a configuration will be described with reference to FIGS. 12 through 15.

Figure 12:
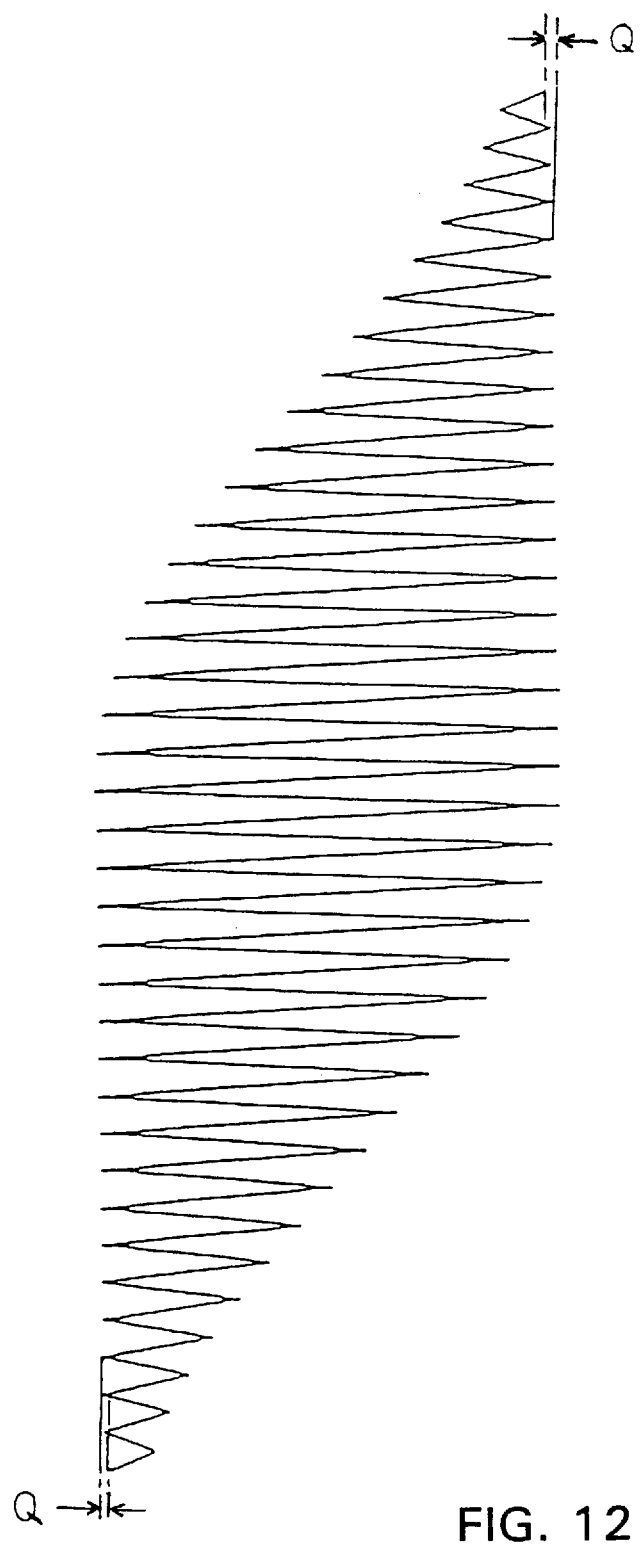
FIG. 12 illustrates an impulse train at a first IDT of a SAW filter according to a third preferred embodiment of the present invention.
Figure 13A:
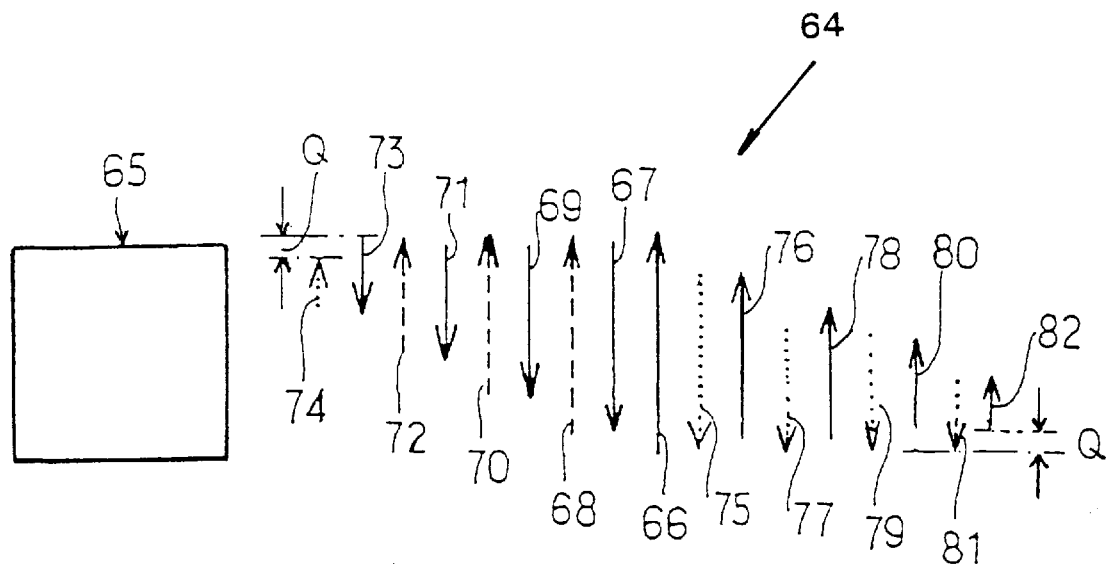
FIG. 13(a) is a schematic configuration diagram illustrating the structure of an electrode of the SAW filter according to the third embodiment of the present invention.
Figure 13B:
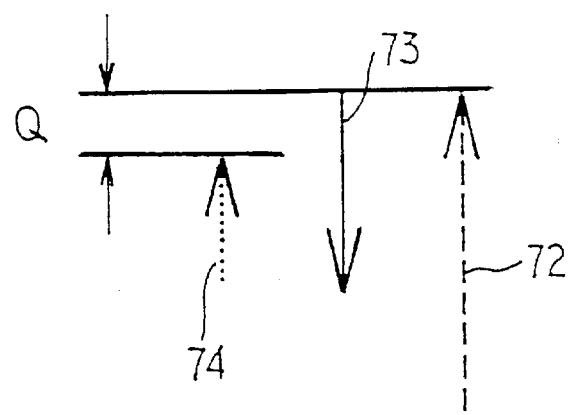
FIG. 13(b) is a partial enlarged view of an end portion of the first IDT.

FIG. 12 illustrates an impulse train corresponding to desired transmission characteristics of a second IDT of the third preferred embodiment of the present invention. In FIG. 12, the ends of the impulses at both ends of the impulse train are shifted inwardly compared to the adjacent impulses by the dimension Q on FIG. 12. FIG. 13(a) schematically illustrates a configuration of a SAW filter according to the third preferred embodiment utilizing a first IDT having such an impulse train.

In the SAW filter according to the third preferred embodiment, a first IDT 64 and a second IDT 65 are arranged so as to be spaced by a predetermined distance on a surface wave substrate (not shown). The second IDT 65 may be configured similarly to the second IDT 15 of a conventional SAW filter (FIG. 5).

The impulses at the first IDT 64 are arranged so that the 2n–th impulse has a magnitude which is the magnitude of the (2n–1)–th impulse multiplied by –1.0 where an impulse 66 at the maximum cross length is the 0–th impulse, and an impulse 74 at the end which is closest to the second IDT 65 is made smaller than the magnitude of an impulse 73 multiplied by –1.0. As a result, the upper end of the impulse 74 is shifted inwardly on the surface wave substrate compared to the upper ends of impulses 67 through 73 by a distance Q (see FIG. 13(b)).

The same arrangement is also made on impulses 75 through 82 on the other side. Specifically, the lower end of the outermost impulse 82 is positioned higher than other impulses 75 through 81 by a distance Q.

Figure 14:
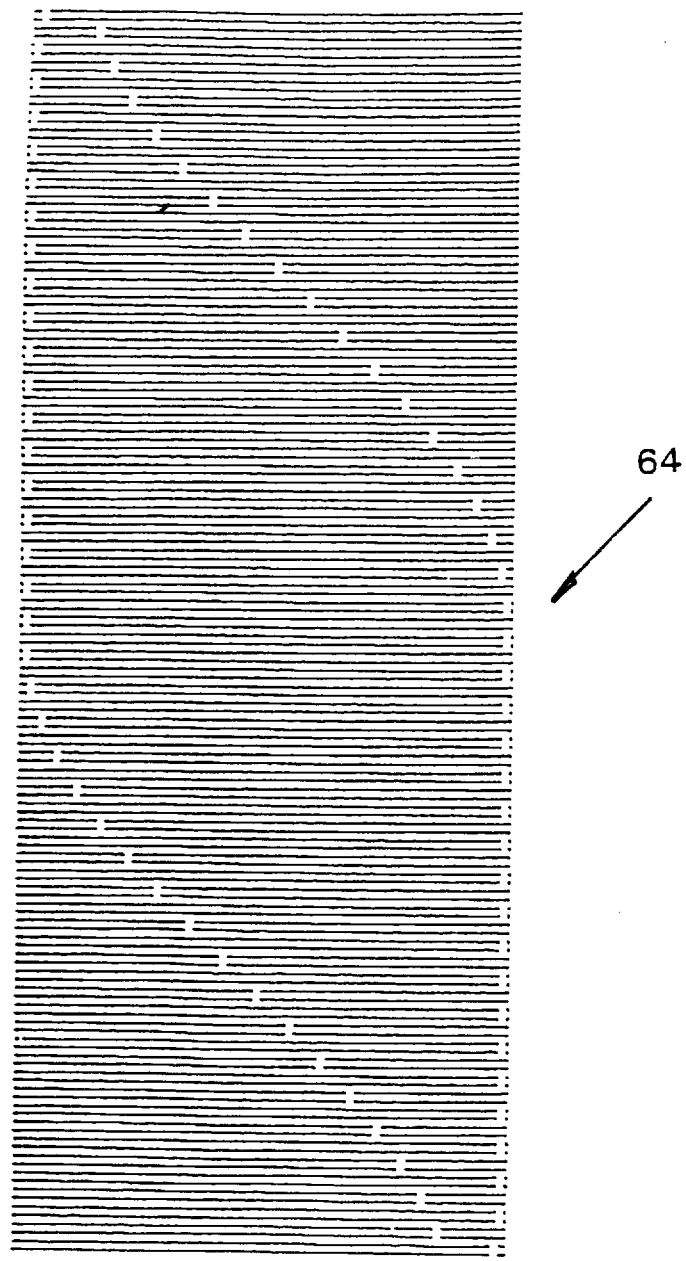
FIG. 14 is a plan view of the first IDT of the SAW filter according to the third preferred embodiment of the present invention.

FIG. 14 illustrates a specific example of such an IDT 64.

According to the third preferred embodiment, excitation of unwanted waves can be effectively suppressed because the upper end of the impulse 74 at the end of the first IDT 64 on the side of the second IDT 65 is retracted inwardly on the surface wave substrate compared to the upper ends of the impulses 66 through 73 by a distance Q.

Figure 15:
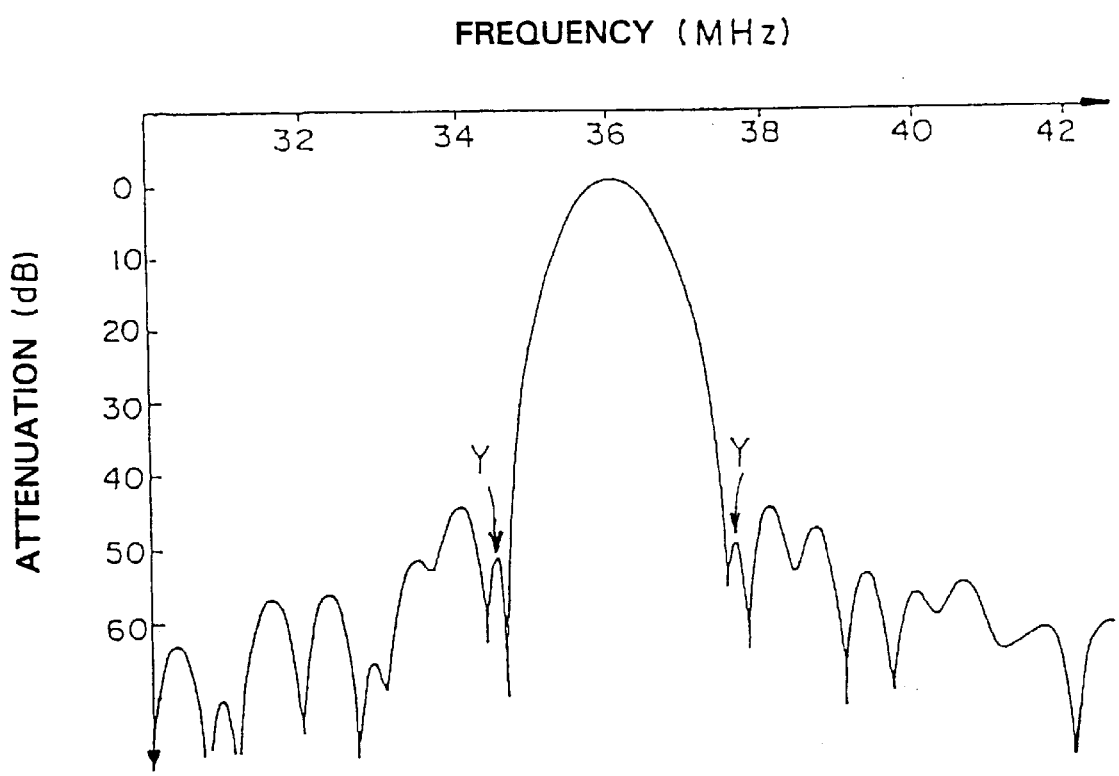
FIG. 15 illustrates attenuation-frequency characteristics of the SAW filter according to the third preferred embodiment of the present invention.

A SAW filter was fabricated according to the third preferred embodiment and the attenuation-frequency characteristics thereof were measured with the result as shown in FIG. 15. In the SAW filter thus fabricated, the first IDT 64 had 36 pairs of electrode fingers and a maximum cross length of 15λ and the second IDT 65 had a normal electrode structure and 20 pairs of electrode fingers. The filter was formed as a SAW filter having a central frequency of 36 MHz, and the surface wave substrate used was obtained by laminating ZnO thin films on a glass substrate.

As apparent from FIG. 15, according to the third preferred embodiment, the configuration of the impulse 74 at the end of the first IDT 64 on the side of the second IDT 65 as described above suppresses unwanted waves, and a sufficient amount of attenuation is achieved at the frequencies indicated by the arrows Y in FIG. 15.

Although the impulse 82 at the end of the IDT 64 opposite to the end where the impulse 74 exists is smaller than the magnitude of the (2n-1)-th impulse multiplied by -1.0 in the third preferred embodiment, this impulse 82 may be configured similarly to its counterparts in the first and second preferred embodiments.

A fourth preferred embodiment of the present invention will now be described.

Figure 16:
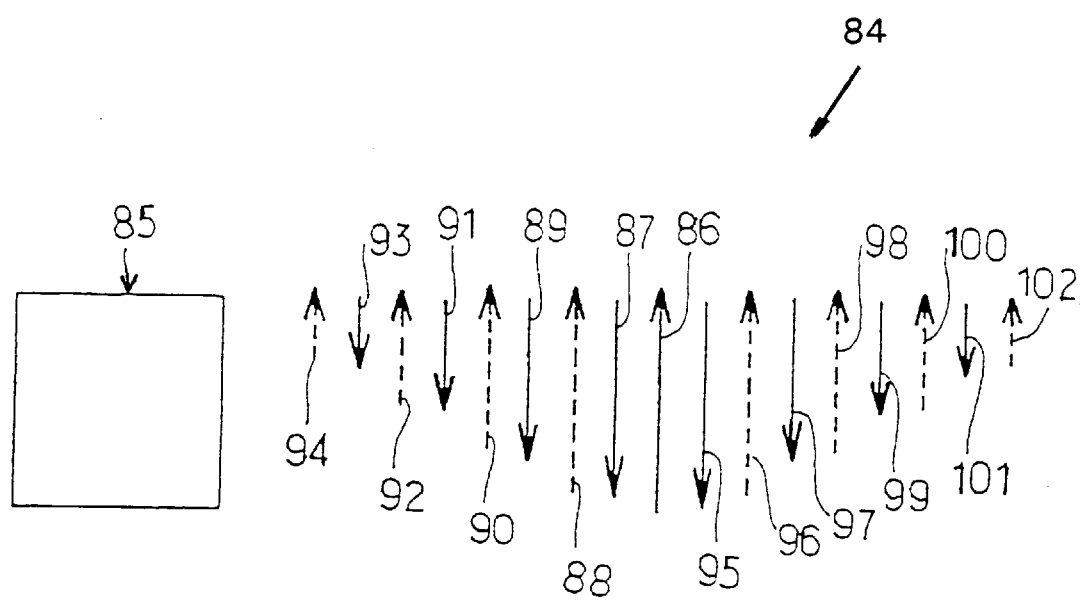
FIG. 16 is a schematic configuration diagram illustrating the structure of an electrode of the SAW filter according to a fourth preferred embodiment of the present invention.

FIG. 16 is a schematic configuration diagram illustrating the structure of an electrode of a SAW filter according to a fourth preferred embodiment of the invention.

In the fourth preferred embodiment, inclined structures are provided on both sides of an impulse 86 at the maximum cross length of a first IDT 84 as in the above-described second preferred embodiment. The fourth preferred embodiment is the same as the second preferred embodiment except that a plurality of impulses 95 through 102 provided farther from a second IDT 85 than the maximum impulse 86 are inclined so that the upper ends thereof are aligned with the upper end of the impulse 86. A plurality of impulses 87 through 94 provided closer to the second IDT 85 than the maximum impulse 86 are configured similarly to those in the second preferred embodiment.

As described above, according to the fourth preferred embodiment, the above-described inclined structure according to the preferred embodiments of the present invention needs not be applied to the plurality of impulses provided farther from the second IDT 85 than the maximum impulse 86, and either of the upper and lower ends of each impulse may be aligned with the upper or lower end of the maximum impulse.

As described above, according to the preferred embodiments of the present invention, an impulse train at a first IDT is arranged so that the impulse in the 2n-th position counted from the maximum impulse at the 0-th position toward or away from a second IDT has a magnitude which is the magnitude of the (2n-1)-th impulse multiplied by -1.0. This makes it possible to reduce the effect of diffraction associated with the propagation of surface waves, allowing preferable attenuation-frequency characteristics to be obtained without increasing the size of the substrate. Especially, the attenuation at attenuation poles in the vicinity of the pass band can be sufficiently increased.

It is therefore possible to provide a SAW filter capable of achieving desired attenuation-frequency characteristics without increasing the size of the surface wave substrate and the cost.

Further, when the 2n-th impulse at the end close to the second IDT is made smaller than the magnitude of the (2n-1)-th impulse multiplied by -1.0, one end of the impulse at the end is retracted inwardly on the surface wave substrate compared to one end of the maximum impulse. This makes it possible to effectively suppress the excitation of unwanted waves at the end of the first IDT, thereby allowing the attenuation-frequency characteristics to be further improved.

It is noted that the exact electrode configurations corresponding to the second, third and fourth embodiments for achieving the impulse trains shown in FIGS. 10, 13 and 16 are not shown in a figure similar to FIG. 6b. These drawings have been omitted in the interest of brevity and because one of ordinary skill in the art given the desired inventive impulse trains shown in FIGS. 10, 13 and 16 would know how to configure the finger electrode configuration to achieve the respective desired impulse trains.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface wave filter, comprising:
   a surface wave substrate;
   a first interdigital transducer provided on the surface wave substrate;
   a second interdigital transducer provided on the surface wave substrate; wherein
   the first interdigital transducer is arranged to create an impulse train including a maximum impulse and a plurality of smaller impulses, the plurality of smaller impulses including a first group of smaller impulses located closer to the second interdigital transducer than the maximum impulse and a second group of smaller impulses located further away from the second interdigital transducer than the maximum impulse, all but a first smaller impulse of the first group of smaller impulses having one end aligned with one end of the maximum impulse.

2. The surface wave filter according to claim 1, wherein the first interdigital transducer is arranged to create the impulse train having a main lobe but no side lobe.

3. The surface wave filter according to claim 2, wherein, except for the first smaller impulse, a smaller impulse located in the 2n-th position from the maximum impulse in the 0-th position of the impulse train has a substantially equal but opposite magnitude as compared to a magnitude of a (2n-1)-th smaller impulse, where n is a natural number.

4. The surface wave filter according to claim 1, wherein the second smaller impulse is located further from the maximum impulse than the remaining impulses of the second group of smaller impulses.

5. The surface wave filter according to claim 4, wherein the first interdigital transducer is arranged to create the impulse train having a main lobe but no side lobe.

6. The surface wave filter according to claim 5, wherein, except for the first and second smaller impulses, a smaller impulse located in the 2n-th position from the maximum impulse in the 0-th position of the impulse train has a substantially equal but opposite magnitude as compared to a magnitude of a (2n-1)-th smaller impulse, where n is a natural number.

7. The surface wave filter according to claim 1, wherein all but a second smaller impulse of the second group of smaller impulses have one end aligned with one end of the maximum impulse.

8. The surface wave filter according to claim 7, wherein the first interdigital transducer is arranged to create the impulse train having a main lobe but no side lobe.

9. The surface wave filter according to claim 8, wherein, except for the first and second smaller impulses, a smaller impulse located in the 2n-th position from the maximum impulse in the 0-th position of the impulse train has a substantially equal but opposite magnitude as compared to a magnitude of a (2n-1)-th smaller impulse, where n is a natural number.

10. The surface wave filter according to claim 1, wherein the first smaller impulse is located closer to the second interdigital transducer than the remaining impulses in the first group of smaller impulses.

11. The surface wave filter according to claim 10, wherein the first interdigital transducer is arranged to create the impulse train having a main lobe but no side lobe.

12. The surface wave filter according to claim 11, wherein, except for the first smaller impulse, a smaller impulse located in the 2n-th position from the maximum impulse in the 0-th position of the impulse train has a substantially equal but opposite magnitude as compared to a magnitude of a (2n-1)-th smaller impulse, where n is a natural number.

* * * * *